(12) United States Patent
Tapily (10) Patent No.: US 10,586,734 B2
(45) Date of Patent: Mar. 10, 2020

(54) METHOD OF SELECTIVE FILM DEPOSITION FOR FORMING FULLY SELF-ALIGNED VIAS

(71) Applicant: Tokyo Electron Limited, Minato-ku, Tokyo (JP)

(72) Inventor: Kandabara Tapily, Albany, NY (US)

(73) Assignee: Tokyo Electron Limited, Tokyo (JP)

( * ) Notice: Subject to any disclaimer, the term of this patent is extended or adjusted under 35 U.S.C. 154(b) by 0 days.

(21) Appl. No.: 16/193,849

(22) Filed: Nov. 16, 2018

(65) Prior Publication Data

US 2019/0157149 A1 May 23, 2019

Related U.S. Application Data

(60) Provisional application No. 62/685,847, filed on Jun. 15, 2018, provisional application No. 62/588,855, filed on Nov. 20, 2017.

(51) Int. Cl.

| | |
|---|---|
| *H01L 21/768* | (2006.01) |
| *H01L 21/02* | (2006.01) |
| *H01L 21/677* | (2006.01) |
| *H01L 21/67* | (2006.01) |
| *C23C 16/00* | (2006.01) |
| *H01L 21/687* | (2006.01) |

(52) U.S. Cl.
CPC ........ *H01L 21/76897* (2013.01); *C23C 16/00* (2013.01); *H01L 21/0228* (2013.01); *H01L 21/02164* (2013.01); *H01L 21/02216* (2013.01); *H01L 21/02301* (2013.01); *H01L 21/02304* (2013.01); *H01L 21/02312* (2013.01); *H01L 21/67196* (2013.01); *H01L 21/67201* (2013.01); *H01L 21/67742* (2013.01); *H01L 21/68764* (2013.01); *H01L 21/68771* (2013.01)

(58) Field of Classification Search
CPC ................................................. H01L 21/76897
USPC ........................................................ 438/761
See application file for complete search history.

(56) References Cited

U.S. PATENT DOCUMENTS

2008/0095816 A1* 4/2008 Gordy ..................... A61L 27/26
424/422
2015/0004806 A1* 1/2015 Ndiege ............. H01L 21/02164
438/789

* cited by examiner

*Primary Examiner* — Jami Valentine Miller (57) ABSTRACT

A substrate processing method for forming fully self-aligned vias. The method may be performed in a batch processing system that is capable of simultaneously processing multiple substrates, where the batch processing system includes a process chamber containing processing spaces defined around an axis of rotation in the process chamber. Each of the substrates contain a first surface and a second surface, and the method includes selectively forming $SiO_2$ raised features on the first surface relative to the second surface.

20 Claims, 5 Drawing Sheets

METHOD OF SELECTIVE FILM DEPOSITION FOR FORMING FULLY SELF-ALIGNED VIAS

CROSS-REFERENCE TO RELATED APPLICATIONS

This application is related to and claims priority to U.S. Provisional Patent Application Ser. No. 62/588,855 filed on Nov. 20, 2017, the entire contents of which are herein incorporated by reference. This application is related to and claims priority to U.S. Provisional Patent Application Ser. No. 62/685,847 filed on Jun. 15, 2018, the entire contents of which are herein incorporated by reference.

FIELD OF THE INVENTION

The present invention relates to semiconductor processing and semiconductor devices, and more particularly, to methods for selective film deposition for forming fully self-aligned vias.

BACKGROUND OF THE INVENTION

As device size is getting smaller, the complexity in semiconductor device manufacturing is increasing. The cost to produce the semiconductor devices is also increasing and cost effective solutions and innovations are needed. As smaller transistors are manufactured, the critical dimension (CD) or resolution of patterned features is becoming more challenging to produce. Selective deposition of thin films is a key step in patterning in highly scaled technology nodes. New deposition methods are required that provide selective film deposition on different material surfaces.

SUMMARY OF THE INVENTION

According to one embodiment, a substrate processing method is provided. The method includes a) arranging substrates on a plurality of substrate supports in a process chamber, where the process chamber contains processing spaces defined around an axis of rotation in the process chamber, each of the substrates containing a first surface and a second surface, and b) rotating the plurality of substrate supports about the axis of rotation. The method further includes c) exposing the substrates to a reactant gas containing a metal-containing catalyst, d) exposing the substrates to a cleaning gas that removes an oxidized layer from the second surface along with the metal-containing catalyst on the oxidized layer, and e) exposing the substrates to a deposition gas containing a silanol gas for a time period that selectively deposits an initial $SiO_2$ film on the metal-containing catalyst on the first surface, where the initial $SiO_2$ film forms a raised feature adjacent the second surface. The method further includes f) exposing the substrates to the reactant gas to selectively coat the raised feature of the initial $SiO_2$ film, but not the second surface, with the metal-containing catalyst, and g) exposing the substrates to the deposition gas containing the silanol gas for a time period that selectively deposits an additional $SiO_2$ film on the metal-containing catalyst on the raised feature of the initial $SiO_2$ film.

BRIEF DESCRIPTION OF THE DRAWINGS

A more complete appreciation of embodiments of the invention and many of the attendant advantages thereof will become readily apparent with reference to the following detailed description, particularly when considered in conjunction with the accompanying drawings, in which.

DETAILED DESCRIPTION OF SEVERAL EMBODIMENTS

Figure 2:
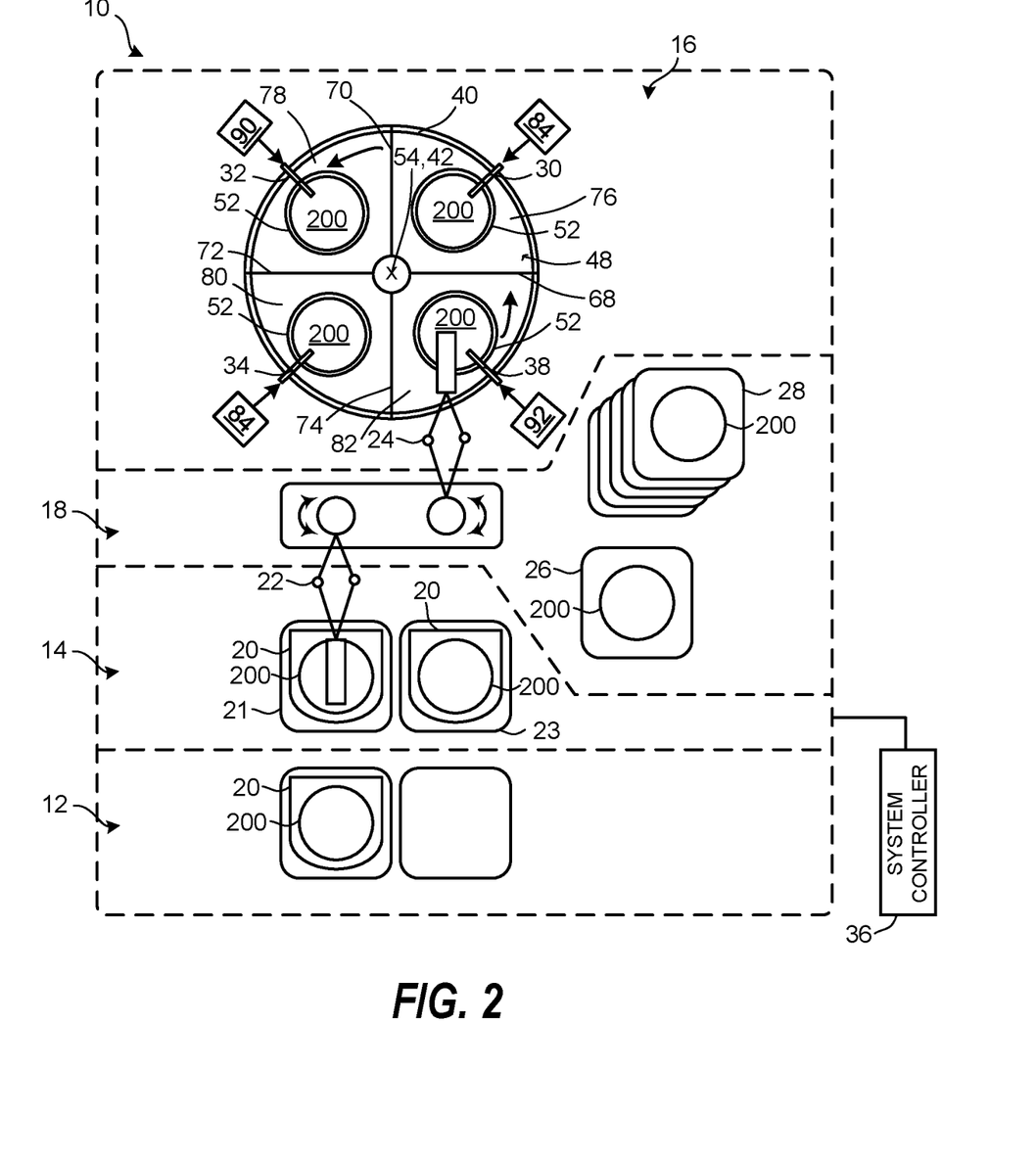
FIG. 2 schematically shows a batch processing system for processing substrates according to an embodiment of the invention.

Some embodiments of the invention provide methods for selective film deposition for forming fully self-aligned vias. The methods may be performed in a batch processing system that is capable of simultaneously processing multiple substrates. One example of a batch processing system is schematically shown in FIG. 2.

Figure 1A:
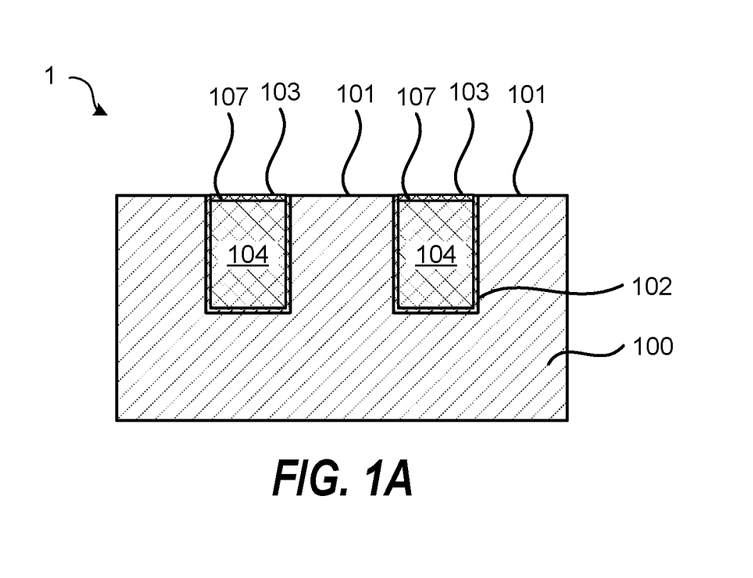
FIGS. 1A-1G show through schematic cross-sectional views a method for selective film deposition for forming fully self-aligned vias according to an embodiment of the invention.

FIGS. 1A-1G show through schematic cross-sectional views a method for selective film deposition for forming fully self-aligned vias according to an embodiment of the invention. In FIG. 1A, the substrate 1 is patterned and planarized and contains a dielectric material 100, a metal layer 104 that is inlaid in the dielectric material 100, and an optional diffusion barrier layer 102 separating the metal layer 104 from the dielectric material 100. The dielectric material 100 has a first surface 101 and the metal layer 104 has a second surface 103. The dielectric material 100 can, for example, contain a low-k dielectric material, $SiO_2$, SiCOH, or a metal-containing dielectric material. In some examples, the dielectric material 100 may contain SiCN or SiOC. In one example, the metal-containing dielectric material can contain a metal oxide, a metal nitride, or a metal oxynitride. In some examples, the optional diffusion barrier layer 102 can contain TaN, TiN, TaSiN, or TiSiN. The metal layer 104 can, for example, contain Cu metal, W metal, Ru metal, or Co metal. A top portion of the metal layer 104 may be oxidized in form of an oxidized metal layer 107. The oxidized metal layer 107 may form by exposure of the metal layer 104 to oxygen-containing gases during substrate processing, including exposures of $O_2$ and $H_2O$ from processing gases or background gases in the processing system(s). In one example, the oxidized metal layer 107 may form during or following a CMP process. In one example, the oxidized metal layer 107 may be incomplete with open areas that expose the metal layer 104.

Figure 1B:
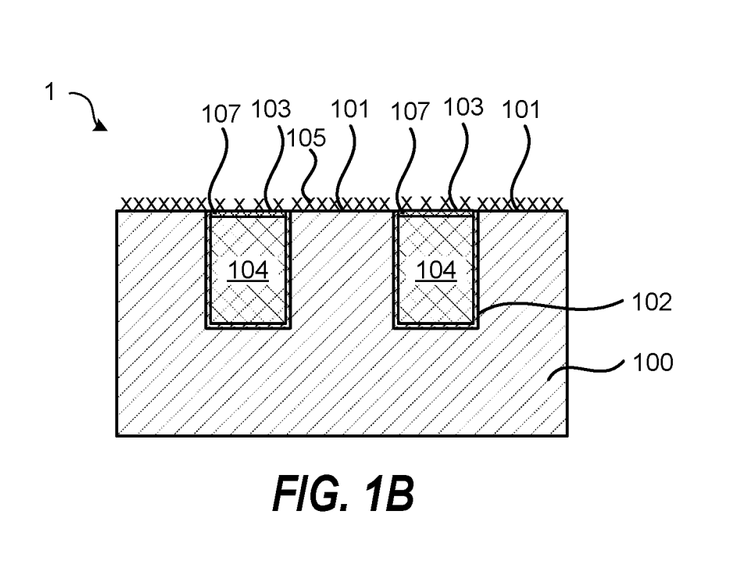

One embodiment includes arranging substrates on a plurality of substrate supports in a process chamber, where the process chamber contains processing spaces defined around an axis of rotation in the process chamber. The method further includes rotating the plurality of substrate supports about the axis of rotation, and exposing the substrates to a reactant gas containing a metal-containing catalyst in one processing space of the process chamber. The exposure to the reactant gas may saturate all the adsorption sites on the substrate 1. The metal-containing catalyst layer 105 ("X" in FIG. 1B), or a partially decomposed metal-containing catalyst, is adsorbed on the first surface 101 and the second surface 103 of the substrate 1 shown in FIG. 1A. As schematically shown in FIG. 1B, a surface density of the metal-containing catalyst layer 105 on the second surface 103 may be lower than on the first surface 101. The presence of the oxidized metal layer 107 can affect subsequent selective $SiO_2$ film deposition by reducing the deposition selectivity. In accordance with some embodiments of the invention, the metal-containing catalyst layer 105 may contain aluminum (Al), titanium (Ti), hafnium (Hf), zirconium (Zr), or a combination thereof. According to one embodiment, the metal-containing catalyst layer 105 may be selected from the group consisting of Al, $Al_2O_3$, AlN, AlON, an Al-containing precursor, an Al-containing alloy, CuAl, TiAlN, TaAlN, Ti, TiAlC, $TiO_2$, TiON, TiN, a Ti-containing precursor, a Ti-containing alloy, and combinations thereof. The metal-containing catalyst layer 105 may be formed by exposing the substrate 1 to a metal-containing precursor vapor and optionally an oxygen-containing gas and/or a nitrogen-containing gas. According to one embodiment, the exposing may proceed by exposing the substrate 1 to a gas pulse containing a metal that adsorbs a metal-containing catalyst layer 105 that is approximately one monolayer thick. In one example, the metal-containing catalyst layer 105 may include a layer of an adsorbed metal-containing precursor, e.g., $AlMe_3$.

Embodiments of the invention may utilize a wide variety of Al-containing precursors. For example, many aluminum precursors have the formula: where $L^1, L^2, L^3$ are individual anionic ligands, and D is a neutral donor ligand where x can be 0, 1, or 2. Each $L^1, L^2, L^3$ ligand may be individually selected from the groups of alkoxides, halides, aryloxides, amides, cyclopentadienyls, alkyls, silyls, amidinates, β-diketonates, ketoiminates, silanoates, and carboxylates. D ligands may be selected from groups of ethers, furans, pyridines, pyroles, pyrolidines, amines, crown ethers, glymes, and nitriles.

Other examples of aluminum precursors include: $AlMe_3$, $AlEt_3$, $AlMe_2H$, $[Al(OsBu)_3]_4$, $Al(CH_3COCHCOCH_3)_3$, $AlCl_3$, $AlBr_3$, $AlI_3$, $Al(OiPr)_3$, $[Al(NMe_2)_3]_2$, $Al(iBu)_2Cl$, $Al(iBu)_3$, $Al(iBu)_2H$, $AlEt_2Cl$, $Et_3Al_2(OsBu)_3$, and $Al(THD)_3$.

Embodiments of the invention may utilize a wide variety of Ti-containing precursors. Examples include Ti-containing precursors having "Ti—N" intra-molecular bonds include $Ti(NEt_2)_4$ (TDEAT), $Ti(NMeEt)_4$ (TEMAT), $Ti(NMe_2)_4$ (TDMAT). Other examples include Ti-containing precursors containing "Ti—C" intra-molecular bonds include $Ti(COCH_3)(\eta^5-C_5H_5)_2Cl$, $Ti(\eta^5-C_5H_5)Cl_2$, $Ti(\eta^5-C_5H_5)Cl_3$, $Ti(\eta^5-C_5H_5)_2Cl_2$, $Ti(\eta^5-C_5(CH_3)_5)Cl_3$, $Ti(CH_3)(\eta^5-C_5H_5)_2Cl$, $Ti(\eta^5-C_9H_7)_2Cl_2$, $Ti((\eta^5-C_5(CH_3)_5)_2Cl$, $Ti((\eta^5-C_5(CH_3)_5)_2Cl_2$, $Ti(\eta^5-C_5H_5)_2(\mu-Cl)_2$, $Ti(\eta^5-C_5H_5)_2(CO)_2$, $Ti(CH_3)_3(\eta^5-C_5H_5)$, $Ti(CH_3)_2(\eta^5-C_5H_5)_2$, $Ti(CH_3)_4$, $Ti(\eta^5-C_5H_5)(\eta^7-C_7H_7)$, $Ti(\eta^5-C_5H_5)(\eta^8-C_8H_8)$, $Ti(C_5H_5)_2(\eta^5-C_5H_5)_2$, $Ti((C_5H_5)_2)_2(\eta-H)_2$, $Ti(\eta^5-C_5(CH_3)_5)_2$, $Ti(\eta^5-C_5(CH_3)_5)_2(H)_2$, and $Ti(CH_3)_2(\eta^5-C_5(CH_3)_5)_2$. $TiCl_4$ is an example of a titanium halide precursor containing a "Ti-halogen" bond.

Figure 1C:
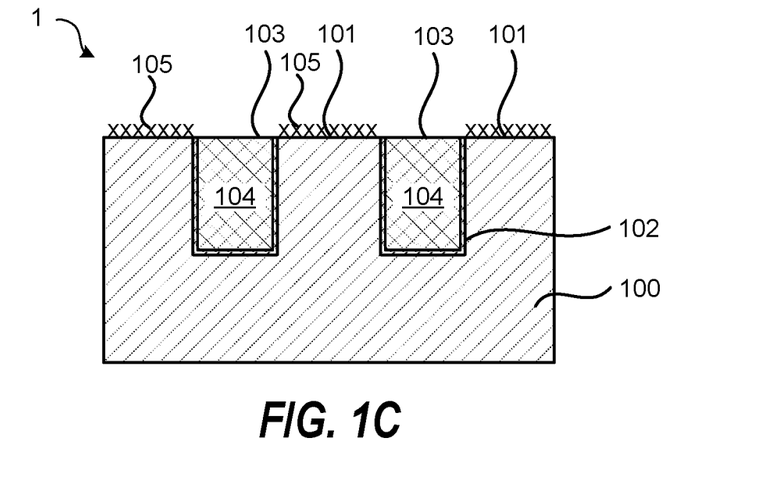

The method further includes exposing the substrates to a cleaning gas that removes the oxidized metal layer 107 from the second surface 103 and the metal-containing catalyst layer 105 on the oxidized metal layer 107. This is schematically shown in FIG. 1C, where the metal-containing catalyst layer 105 remains on the first surface 101. The cleaning gas effectively lifts off the oxidized metal layer 107 without reoxidizing the metal layer 104, and further removes the metal-containing catalyst layer 105 in the lift-off process since the metal-containing catalyst layer 105 is bonded to the oxidized metal layer 107 that is being removed. The cleaning gas may contain one or more alcohols with a chemical formula R—OH. One class of alcohols is primary alcohols, of which methanol and ethanol are the simplest members. Another class of alcohols is secondary alcohols, for example isopropyl alcohol (IPA).

Figure 1D:
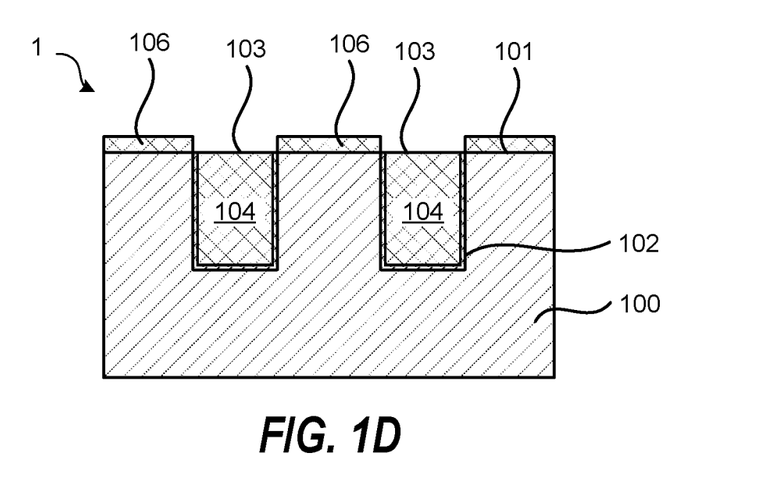

The method further includes exposing the substrates to a deposition gas containing a silanol gas for a time period that selectively deposits an initial $SiO_2$ film 106 in a self-limiting way on the metal-containing catalyst layer 105 on the first surface 101, but not on the second surface 103, where the initial $SiO_2$ film 106 forms a raised feature adjacent the second surface 103. This is schematically shown in FIG. 1D.

The metal-containing catalyst layer 105 catalyzes the selective deposition of the initial $SiO_2$ film 106 from the silanol gas, and this catalytic effect is observed until the deposited $SiO_2$ film 106 is about 15 nm thick, or less, depending on processing conditions, and then the $SiO_2$ deposition automatically stops. The exposure to the deposition gas may be carried out for a time period that does not result in significant $SiO_2$ deposition on the second surface 103 of the metal layer 104. According to embodiments of the invention, the substrate 1 is exposed to the deposition gas containing a silanol gas in the absence of any oxidizing and hydrolyzing agent. In one example, the silanol gas may be selected from the group consisting of tris(tert-pentoxy) silanol (TPSOL), tris(tert-butoxy) silanol, and bis(tert-butoxy)(isopropoxy) silanol. In one example, the deposition gas consists of the silanol gas and an inert gas such as Argon. Furthermore, according to one embodiment, the substrate temperature may be approximately 150° C., or less, during the exposing. In another embodiment, the substrate temperature may be approximately 120° C., or less. In yet another embodiment, the substrate temperature may be approximately 100° C., or less.

According to one embodiment, the sequential steps of exposing the substrates to the reactant gas containing the metal-containing catalyst, exposing the substrates to the cleaning gas, and exposing the substrates to the deposition gas containing a silanol gas may be repeated at least once to increase the thickness of the initial $SiO_2$ film 106 on the substrate 1. The processing conditions may be selected such that up to about 15 nm of the initial $SiO_2$ film 106 may be deposited during a single exposure to the deposition gas and then the $SiO_2$ deposition automatically stops. In some examples, less than about 15 nm, less than about 10 nm, or less than about 5 nm of the initial $SiO_2$ film 106 may be deposited during a single exposure to the deposition gas containing a silanol gas. In one example, the substrate supports may be rotated about the axis of rotation in the process chamber at about 100 rpm or less during the sequential steps of exposing the substrates to the reactant gas containing the metal-containing catalyst, exposing the substrates to the cleaning gas, and exposing the substrates to the deposition gas containing the silanol gas.

Figure 1E:
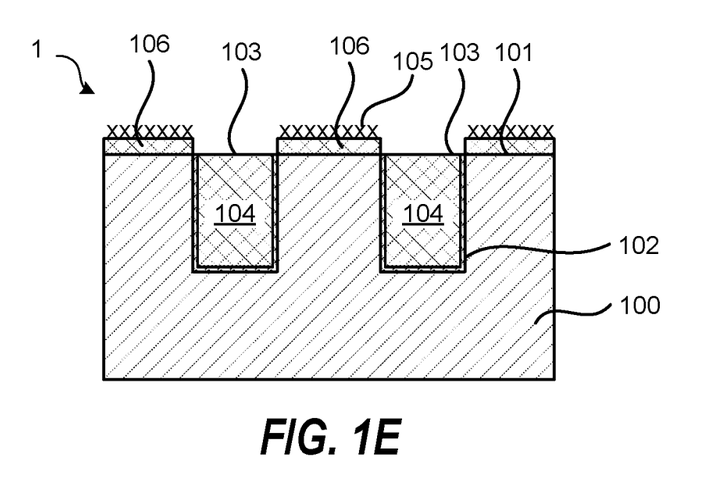

The method further includes exposing the substrates to the reactant gas to selectively coat the raised features of the initial $SiO_2$ film 106, but not the second surface 103, with the metal-containing catalyst layer 105. This is schematically shown in FIG. 1E. A rotation speed of the plurality of substrate supports in the process chamber and the exposure parameters may be selected such that the reactant gas containing the metal-containing catalyst is preferentially exposed to the top surface of the initial $SiO_2$ film 106 but not the second surface 103. The selective coating is at least in part due to the initial $SiO_2$ film 106 forming a raised feature above the second surface 103 and the reactant gas not diffusing into the spaces between raised features and coating the second surface 103. Further, since the metal layer 104 is not oxidized, the adsorption of the metal-containing catalyst on the second surface 103 is reduced or prevented.

Figure 1F:
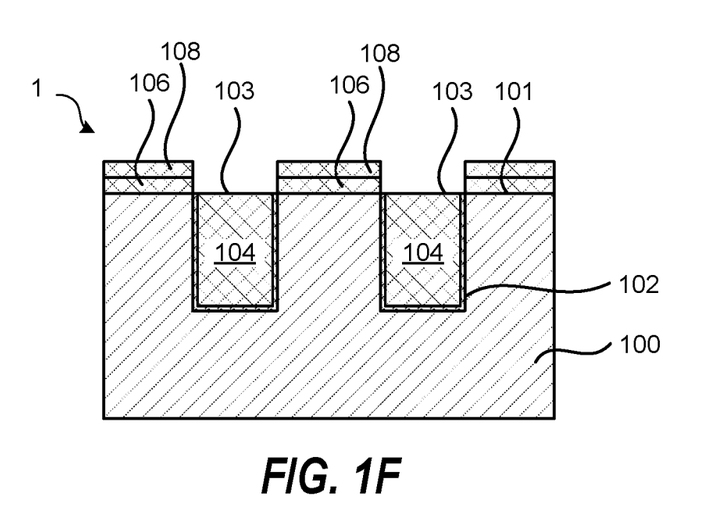

Thereafter, the method further includes exposing the substrates to the deposition gas containing the silanol gas for a time period that selectively deposits an additional $SiO_2$ film 108 on the metal-containing catalyst layer 105 on the raised features of the initial $SiO_2$ film 106. This is schematically shown in FIG. 1F. Since the adsorption of the metal-containing catalyst on the second surface 103 is reduced or prevented, the step of exposing the substrates to the cleaning gas may be omitted from the sequence of steps when depositing the additional $SiO_2$ film 108 on the initial $SiO_2$ film 106.

Figure 1G:
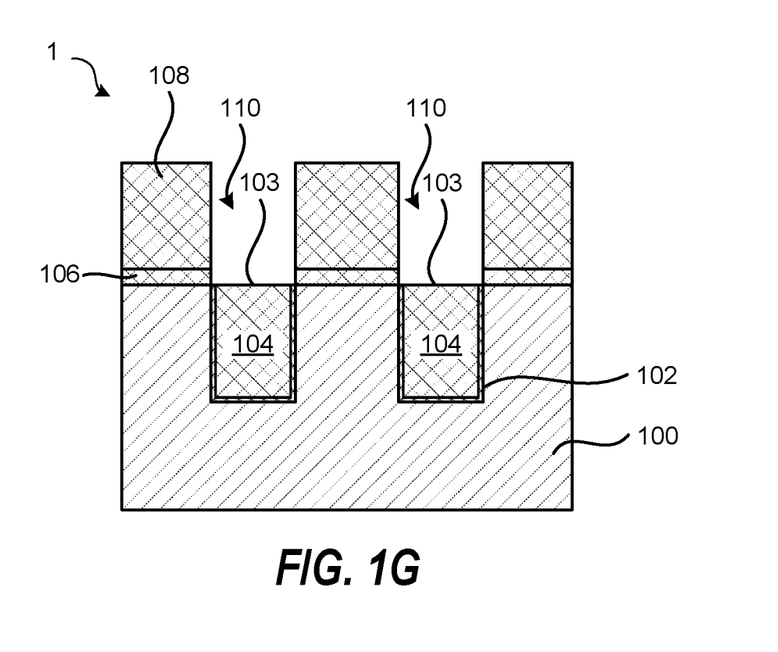

According to one embodiment, the sequential steps of exposing the substrates to the reactant gas containing the metal-containing catalyst, and exposing the substrates to the deposition gas containing the silanol gas to selectively deposit the additional $SiO_2$ film 108 may be repeated at least once to increase the thickness of the additional $SiO_2$ film 108 on the initial $SiO_2$ film 106. This is schematically shown in FIG. 1G. In one example, the thickness of the additional Sift film 108 can be between about 50 nm and about 100 nm. In one example, the substrate supports may be rotated about the axis of rotation at greater than 100 rpm during the sequential steps of exposing the substrates to a reactant gas containing a metal-containing catalyst and exposing the substrates to a deposition gas containing a silanol gas. The processing conditions may be selected such that up to about 15 nm of the additional $SiO_2$ film 108 may be deposited during a single exposure to the deposition gas and then the $SiO_2$ deposition automatically stops. In some examples, less than about 15 nm, less than about 10 nm, or less than about 5 nm of the additional $SiO_2$ film 108 may be deposited during a single exposure to the deposition gas containing a silanol gas.

As seen in FIG. 1G, the initial $SiO_2$ film 106 and the additional $SiO_2$ film 108 form fully self-aligned vias 110 above the metal layers 104. The fully self-aligned vias 110 may also be referred to as holes or trenches. The method provides selective film deposition to form fully self-aligned vias in highly scaled technology nodes. The vias can, for example, have widths that are less than about 50 nm, less than about 20 nm, less than about 10 nm, or less than about 5 nm. Those vias are challenging to manufacture using conventional lithography methods.

FIG. 2 schematically shows a batch processing system for processing substrates according to an embodiment of the invention. The batch processing system 10 is configured for processing a plurality of substrates 200 and includes an input/output station 12, a load/lock station 14, a process chamber 16, and a transfer chamber 18 interposed between the load/lock station 14 and process chamber 16. The batch processing system 10, which is shown in a simplified manner, may include additional structures, such as additional vacuum-isolation walls coupling the load/lock station 14 with the transfer chamber 18 and the process chamber 16 with the transfer chamber 18, as understood by a person having ordinary skill in the art. The input/output station 12, which is at or near atmospheric pressure (e.g., 760 Torr), is adapted to receive wafer cassettes 20, such as front opening unified pods (FOUPs). The wafer cassettes 20 are sized and shaped to hold a plurality of substrates 200, such as semiconductor wafers having diameters of, for example, 200 or 300 millimeters.

The load/lock station 14 is adapted to be evacuated from atmospheric pressure to a vacuum pressure and to be vented from vacuum pressure to atmospheric pressure, while the process chamber 16 and transfer chamber 18 are isolated and maintained continuously under vacuum pressures. The load/lock station 14 holds a plurality of the wafer cassettes 20 introduced from the atmospheric pressure environment of the input/output station 12. The load/lock station 14 includes platforms 21, 23 that each support one of the wafer cassettes 20 and that can be vertically indexed to promote wafer transfers to and from the process chamber 16.

A wafer transfer mechanism 22 transfers substrates 200 under vacuum from one of the wafer cassettes 20 in the load/lock station 14 through the transfer chamber 18 and into the process chamber 16. Another wafer transfer mechanism 24 transfers substrates 200 processed in the process chamber 16 under vacuum from the process chamber 16 through the transfer chamber 18 and to the wafer cassettes 20. The wafer transfer mechanisms 22, 24, which operate independently of each other for enhancing the throughput of the batch processing system 10, may be selective compliant articulated/assembly robot arm (SCARA) robots commonly used for pick-and-place operations. The wafer transfer mechanisms 22, 24 include end effectors configured to secure the substrates 200 during transfers. The process chamber 16 may include distinct first and second sealable ports (not shown) used by wafer transfer mechanisms 22, 24, respectively, to access processing spaces inside the process chamber 16. The access ports are sealed when substrate processing is occurring in the process chamber 16. Wafer transfer mechanism 22 is depicted in FIG. 2 as transferring unprocessed substrates 200 from wafer cassettes 20 on platform 21 of the load/lock station 14 to the process chamber 16. Wafer transfer mechanism 24 is depicted in FIG. 2 as transferring processed substrates 200 from the process chamber 16 to wafer cassettes 20 on platform 23 of the load/lock station 14.

The wafer transfer mechanism 24 may also transfer processed substrates 200 extracted from the process chamber 16 to a metrology station 26 for examination or to a cool down station 28 used for post-processing low pressure cooling of the substrates 200. The processes performed in the metrology station 26 may include, but are not limited to, conventional techniques used to measure film thickness and/or film composition, such as ellipsometry, and particle measurement techniques for contamination control.

The batch processing system 10 is equipped with a system controller 36 programmed to control and orchestrate the operation of the batch processing system 10. The system controller 36 typically includes a central processing unit (CPU) for controlling various system functions, chamber processes and support hardware (e.g., detectors, robots, motors, gas sources hardware, etc.) and monitoring the system and chamber processes (e.g., chamber temperature, process sequence throughput, chamber process time, input/output signals, etc.). Software instructions and data can be coded and stored within the memory for instructing the CPU. A software program executable by the system controller 36 determines which tasks are executed on substrates 200 including tasks relating to monitoring and execution of the processing sequence tasks and various chamber process recipe steps.

A susceptor 48 is disposed inside the process chamber 16. The susceptor 48 includes a plurality of circular substrate supports 52 defined in a top surface of the susceptor 48. Each of the substrate supports 52 is configured to hold at least one of the substrates 200 at a location radially within the peripheral sidewall 40 of the process chamber 16. The number of individual substrate supports 52 may range, for example, from 2 to 8. However, a person having ordinary skill in the art would appreciate that the susceptor 48 may be configured with any desired number of substrate supports 52 depending on the dimensions of the substrates 200 and the dimensions of the susceptor 48. Although this embodiment of the invention is depicted as having substrate supports 52 of a circular or round geometrical shape, one of ordinary skill in the art would appreciate that the substrate supports 52 may be of any desired shape to accommodate an appropriately shaped substrate.

The batch processing system 10 may be configured to process 200 mm substrates, 300 mm substrates, or larger-sized round substrates, which dimensioning will be reflected in the dimensions of substrate supports 52. In fact, it is contemplated that the batch processing system 10 may be configured to process substrates, wafers, or liquid crystal displays regardless of their size, as would be appreciated by those skilled in the art. Therefore, while aspects of the invention will be described in connection with the processing of substrates 200 that are semiconductor substrates, the invention is not so limited.

The substrate supports 52 are distributed circumferentially on the susceptor 48 about a uniform radius centered on an axis of rotation 54. The substrate supports 52 have approximately equiangular spacing about the axis of rotation 54, which is substantially collinear or coaxial with the azimuthal axis 42 although the invention is not so limited.

When the substrates 200 are processed in the process chamber 16, the rotation of the susceptor 48 may be continuous and may occur at a constant angular velocity about the axis of rotation 54. Alternatively, the angular velocity may be varied contingent upon the angular orientation of the susceptor 48 relative to an arbitrary reference point.

Partitions 68, 70, 72, 74 compartmentalize the process chamber 16 into a plurality of processing spaces 76, 78, 80, 82, while allowing the susceptor 48 and the substrate supports 52 to freely rotate around the axis of rotation 54. The partitions 68, 70, 72, 74 extend radially relative to the axis of rotation 54 toward the peripheral sidewall 40. Although four partitions 68, 70, 72, 74 are representatively shown, a person having ordinary skill in the art would appreciate that the process chamber 16 may be subdivided with any suitable plurality of partitions to form a different number than four processing spaces. According to another embodiment, the partitions 68, 70, 72, 74 may be omitted and purge gases may be flowed into the process chamber 16 between one or more of the plurality of processing spaces 76, 78, 80, 82. According to one embodiment, one or more of the processing spaces 76, 78, 80, 82 may be used for gas purging.

The batch processing system 10 further includes a purge gas supply system 84 coupled by gas lines to gas injectors 30, 34 penetrating through the peripheral sidewall 40. The purge gas supply system 84 is configured to introduce a flow of a purge gas to processing spaces 76 and 80. The purge gas introduced into the processing spaces 76 and 80 can comprise an inert gas, such as a noble gas (i.e., helium, neon, argon, xenon, krypton), or nitrogen, or hydrogen. During substrate processing, purge gas may be continuously introduced into the processing spaces 76 and 80 to provide a gaseous curtain or barrier preventing, or at the least significantly limiting, transfer of first and second process materials between processing spaces 78, 82. The purge gas also provides an inert atmosphere inside processing spaces 76, 80 so that any process material layers carried by the substrates 200 are substantially unchanged when transported on the susceptor 48 through processing spaces 76, 80. Processing space 78 is juxtaposed between processing spaces 76, 80 and processing space 82 is juxtaposed between processing spaces 76, 80 so that processing spaces 76, 80 separate processing spaces 78 and 82 to provide mutual isolation for the first and second process materials.

Batch processing system 10 further includes a first process material supply system 90 coupled by gas lines to gas injector 32 penetrating through the peripheral sidewall 40, and a second process material supply system 92 coupled by gas lines to gas injector 38 penetrating through the peripheral sidewall 40. The first process material supply system 90 is configured to introduce a first process material to processing space 78, and a second process material supply system 92 configured to introduce a second process material to processing space 82. The first and second process material supply systems 90, 92 may each include one or more material sources, one or more heaters, one or more pressure control devices, one or more flow control devices, one or more filters, one or more valves, or one or more flow sensors as conventionally found in such process material supply systems.

The first process material can, for example, include a reactant gas containing a metal-containing catalyst. For example, the reactant gas may be delivered to processing space 78 in gaseous phase, and either with or without the assistance of a carrier gas. The second process material can, for example, comprises a deposition gas containing a silanol gas. For example, the deposition gas may be delivered to processing space 82 in gaseous phase, and either with or without the assistance of a carrier gas.

According to one embodiment, one or more of the first process material supply system 90, the second process material supply system 92, and the purge gas supply system 84 may be further configured for injecting a cleaning gas into one or more of the processing spaces 76, 78, 80, 82. According to one embodiment, the cleaning gas may contain of one or more alcohols.

When the susceptor 48 is rotated about the axis of rotation 54, the arrangement of the substrate supports 52 about the circumference of the susceptor 48 allows each substrate 200 to be sequentially exposed to the different environment inside each of the processing spaces 76, 78, 80, 82. By way of example, upon rotation of the susceptor 48 through a closed path of a radians (360°), each of the substrates 200 is serially exposed to first process material in the environment inside the first processing space 78, then to the purge gas comprising the environment inside the second processing space 80, then to the second process material in the environment inside the third processing space 82, and finally to the purge gas comprising the environment inside the fourth processing space 76. Each of the substrates 200 has a desired dwell time in each of the respective processing spaces 76, 78, 80, 82, as mandated by the characteristics of the film to be deposited on each of the substrates 200, sufficient to form the film.

The deposition process is a deposition technique in which deposition of each atomic layer of the thin film, or a fraction thereof, on the substrates 200 is controlled by alternating and sequential introduction of appropriate gas phase precursors that react in a self-limiting manner to incrementally form or build the thin film. Within the first processing space 78, molecules of the first process material bond (chemically, by absorption, by adsorption, etc.) to the top surface of each of the substrates 200 to form a monolayer or a fraction of a monolayer of the first process material. Within the third processing space 82, the second process material reacts with the molecules of the first process material on each successive substrate 200. As the substrates 200 are rotated through the first and third processing spaces 78, 82, these steps are repeated with sequential subsequent exposures to the first and second process materials. The environments of first and second process materials in the first and third processing spaces 78, 82, respectively, are isolated from each other by the chemically non-reactive, purge gas environments inside the second and fourth processing spaces 80, 76. The substrates 200 may be heated to a process temperature to promote the deposition process.

Methods for selective film deposition for forming fully self-aligned vias have been disclosed in various embodiments. The foregoing description of the embodiments of the invention has been presented for the purposes of illustration and description. It is not intended to be exhaustive or to limit the invention to the precise forms disclosed. This description and the claims following include terms that are used for descriptive purposes only and are not to be construed as limiting. Persons skilled in the relevant art can appreciate that many modifications and variations are possible in light of the above teaching. Persons skilled in the art will recognize various equivalent combinations and substitutions for various components shown in the Figures. It is therefore intended that the scope of the invention be limited not by this detailed description, but rather by the claims appended hereto.

What is claimed is:

1. A substrate processing method, comprising:
   a) arranging substrates on a plurality of substrate supports in a process chamber, wherein the process chamber contains processing spaces defined around an axis of rotation in the process chamber, each of the substrates containing a first surface and a second surface;
   b) rotating the plurality of substrate supports about the axis of rotation;
   c) exposing the substrates to a reactant gas containing a metal-containing catalyst;
   d) exposing the substrates to a cleaning gas that removes an oxidized layer from the second surface along with the metal-containing catalyst on the oxidized layer;
   e) exposing the substrates to a deposition gas containing a silanol gas for a time period that selectively deposits an initial $SiO_2$ film on the metal-containing catalyst on the first surface, wherein the initial $SiO_2$ film forms a raised feature adjacent the second surface;
   f) exposing the substrates to the reactant gas to selectively coat the raised feature of the initial $SiO_2$ film, but not the second surface, with the metal-containing catalyst; and
   g) exposing the substrates to the deposition gas containing the silanol gas for a time period that selectively deposits an additional $SiO_2$ film on the metal-containing catalyst on the raised feature of the initial $SiO_2$ film.

2. The method of claim 1, wherein the first surface includes a dielectric material and the second surface includes a metal layer.

3. The method of claim 1, further comprising:
   before performing step f), repeating steps c)-e) at least once to increase the thickness of the initial $SiO_2$ film.

4. The method of claim 1, further comprising:
   repeating steps f) and g) at least once to increase the thickness of the additional $SiO_2$ film on the initial $SiO_2$ film.

5. The method of claim 1, wherein steps f) and g) are performed without an intervening step of exposing the substrates to the cleaning gas.

6. The method of claim 1, wherein the reactant gas includes aluminum (Al), titanium (Ti), hafnium (Hf), zirconium (Zr), or a combination thereof.

7. The method of claim 1, wherein the reactant gas includes trimethylaluminum ($AlMe_3$).

8. The method of claim 1, wherein the exposing the substrate to the deposition gas containing the silanol gas is performed in the absence of any oxidizing and hydrolyzing agent at a substrate temperature of approximately 150° C., or less.

9. The method of claim 1, wherein the substrate temperature is about 100° C., or less, during the exposing steps.

10. The method of claim 1, wherein the deposition gas consists of the silanol gas and an inert gas.

11. The method of claim 1, wherein the silanol gas is selected from the group consisting of tris(tert-pentoxy) silanol, tris(tert-butoxy) silanol, and bis(tert-butoxy)(isopropoxy) silanol.

12. The method of claim 1, wherein the initial and additional $SiO_2$ films are deposited on the metal-containing catalyst in a self-limiting process.

13. The method of claim 1, wherein a thickness of the initial $SiO_2$ film is about 15 nm or less.

14. The method of claim 1, wherein the initial $SiO_2$ film deposited by sequentially performing steps c)-e) only once.

15. The method of claim 1, wherein the thickness of the additional $SiO_2$ film is between about 50 nm and about 100 nm.

16. The method of claim 1, wherein the cleaning gas includes an alcohol.

17. The method of claim 16, wherein the alcohol includes isopropyl alcohol, methanol, or ethanol.

18. The method of claim 1, wherein steps c)-e) include injecting the reactant gas into a first processing space defined by a first included angle about the axis of rotation;
   exposing the first and second surfaces of each of the substrates to the reactant gas in the first processing space during each full rotation;
   injecting the cleaning gas into a second processing space defined by a second included angle about the axis of rotation and separated from the first processing space;
   exposing the first and second surfaces of each of the substrates to the cleaning gas during each full rotation; and
   injecting the deposition gas containing the silanol gas into a third processing space defined by a third included angle about the axis of rotation and separated from the first and second processing spaces.

19. The method of claim 18, further comprising
   re-exposing the first and second surfaces of each of the substrates to the reactant gas, cleaning gas, and deposition gas by repeatedly rotating the substrates through the first, second, and third processing spaces for incrementally depositing the initial $SiO_2$ film on each of the substrates.

20. The method of claim 1, wherein steps f)-g) include
   injecting the reactant gas into a first processing space defined by a first included angle about the axis of rotation;
   exposing the first surfaces of each of the substrates to the reactant gas in the first processing space during each full rotation;
   injecting the deposition gas containing the silanol gas into a second processing space defined by a second included angle about the axis of rotation and separated from the first processing space; and
   re-exposing the first and second surfaces of each of the substrates to the reactant gas and the deposition gas by repeatedly rotating the substrates through the first and second processing spaces for incrementally depositing the additional $SiO_2$ film on each of the substrates.

* * * * *